US010021791B2

(12) United States Patent
Sugiyama et al.

(10) Patent No.: US 10,021,791 B2
(45) Date of Patent: Jul. 10, 2018

(54) MULTILAYER WIRING SUBSTRATE

(71) Applicant: TAIYO YUDEN CO., LTD., Tokyo (JP)

(72) Inventors: Yuichi Sugiyama, Tokyo (JP); Masashi Miyazaki, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 114 days.

(21) Appl. No.: 14/841,278

(22) Filed: Aug. 31, 2015

(65) Prior Publication Data
US 2016/0066417 A1 Mar. 3, 2016

(30) Foreign Application Priority Data

Sep. 3, 2014 (JP) .................................. 2014-179470

(51) Int. Cl.
| | |
|---|---|
| *H05K 7/00* | (2006.01) |
| *H05K 3/46* | (2006.01) |
| *H01L 23/14* | (2006.01) |
| *H05K 1/18* | (2006.01) |
| *H01L 23/498* | (2006.01) |
| *H05K 3/42* | (2006.01) |

(52) U.S. Cl.
CPC ......... *H05K 3/4641* (2013.01); *H01L 23/142* (2013.01); *H01L 23/49822* (2013.01); *H01L 23/49827* (2013.01); *H01L 2224/16225* (2013.01); *H05K 1/185* (2013.01); *H05K 3/429* (2013.01); *H05K 3/4608* (2013.01); *H05K 2201/10674* (2013.01); *H05K 2203/061* (2013.01)

(58) Field of Classification Search
CPC ......... H01L 2224/16225; H01L 23/142; H01L 23/49822; H01L 23/49827; H05K 1/185; H05K 2201/10674; H05K 2203/061; H05K 3/429; H05K 3/4608; H05K 3/4641
See application file for complete search history.

(56) References Cited

U.S. PATENT DOCUMENTS

| RE45,146 E | 9/2014 | Miyazaki et al. | |
|---|---|---|---|
| 2006/0255440 A1* | 11/2006 | Miyazaki .......... | H01L 23/49822 257/679 |
| 2009/0065941 A1* | 3/2009 | La Tulipe, Jr. ... | H01L 21/76802 257/761 |
| 2009/0316373 A1* | 12/2009 | Kim .................... | H01L 23/5389 361/764 |
| 2011/0116246 A1* | 5/2011 | Lee .......................... | H05K 1/18 361/761 |
| 2014/0182895 A1* | 7/2014 | Lee ...................... | H05K 1/0271 174/251 |

FOREIGN PATENT DOCUMENTS

JP  2003-347741 A  12/2003

* cited by examiner

*Primary Examiner* — Yuriy Semenenko
(74) *Attorney, Agent, or Firm* — Chen Yoshimura LLP

(57) ABSTRACT

In one embodiment of the present invention, a multilayer wiring substrate includes: a first wiring substrate having a first core member made of metal with cavities therein; a second wiring substrate having a second core member made of metal; and a bonding layer between the first wiring substrate and the second wiring substrate to bond a top surface of the first wiring substrate to a bottom surface of the second wiring substrate, the bonding layer having a patterned conductive layer.

7 Claims, 8 Drawing Sheets

MULTILAYER WIRING SUBSTRATE

BACKGROUND OF THE INVENTION

Technical Field

The present invention relates to a multilayer wiring substrate having a metal core layer.

Background Art

The miniaturization and increasing functionality of electronic devices in recent years has led to demand for ever smaller wiring substrates, package components, and the like for these electronic devices, as well as higher density mounting capabilities for these components. Patent Document 1, for example, discloses a composite multilayer substrate having a metal core member, a resin layer covering at least the front surface and rear surface of the core member, and an electronic component mounted in a bottomless hole that penetrates the front and rear of the core member. In this type of multilayer substrate, components can be mounted three-dimensionally, which facilitates miniaturization and high-density mounting, and can ensure protection and high heat dissipating characteristics of the components.

Related Art Document

Patent Document

Patent Document 1: Japanese Patent Application Laid-Open Publication No. 2003-347741

SUMMARY OF THE INVENTION

There has been demand in recent years for circuit designs that can allow further high-density mounting and stable performance of the desired operations of the mounted electronic components in multilayer wiring substrates in which a metal core member is embedded. If the number of wiring layers interposed between the core member and the surface mounted components is increased, for example, then the wiring path among the components becomes longer, which may make it difficult to ensure the desired device characteristics or which may lead to a drop in substrate rigidity, heat dissipation characteristics, or the like.

Accordingly, the present invention is directed to a multilayer wiring substrate that substantially obviates one or more of the problems due to limitations and disadvantages of the related art. In view of the above-mentioned issues, an aim of the present invention is to provide a multilayer wiring substrate that can reduce the adverse effects caused by increasing the number of wiring layers.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a multilayer circuit substrate, including: a first wiring substrate having a first core member made of metal with cavities therein; a second wiring substrate having a second core member made of metal; and a bonding layer between the first wiring substrate and the second wiring substrate to bond a top surface of the first wiring substrate to a bottom surface of the second wiring substrate, the bonding layer having a patterned conductive layer.

The multilayer wiring substrate has a first wiring substrate having a first core member and a second wiring substrate having a second core member. Increasing the number of layers of the core members allows for wiring layers to be provided on both surfaces of the respective core members; therefore, it is possible to secure the number of wiring layers while shortening the wiring paths among the components, and thus possible to stabilize the desired device characteristics. Furthermore, increasing the layers of the core members allows for the rigidity and heat dissipation characteristics of the substrate to be improved further.

Moreover, the bonding layer has a patterned conductive layer, and thus using a portion of the wiring as this conductive layer makes it possible to enhance circuit design freedom. The bonding layer is typically made of an adhesive layer or pressure-sensitive adhesive layer that bonds the first and second wiring substrates to one another.

The cavities formed in the first core member typically house the electronic components. This allows for the mounting density of the components to be improved. It should be noted that, alternatively, a synthetic resin material can be filled into the cavities. The number, size, and shape of the cavities have no particular limitations. The cavities may be bottomless holes that penetrate the first core member, or may be bottomed holes. The cavities may be formed in the second core member in addition to the first core member.

The first and second core members are typically formed of a metal material having excellent rigidity and heat dissipating characteristics, such as copper. The first and second core members may be formed as a portion of wiring, or can be formed as ground wiring that connects to ground, for example. The thickness of the first and second core members has no particular limitations, and is typically greater than the individual wiring patterns forming the wiring layers. The thickness of the first and second core members may be the same as each other or different from each other. The second core member can be made thicker than the first core member to suppress warping of the multilayer wiring substrate, for example.

The first wiring substrate typically further includes a top wiring layer and electronic components. The top wiring layer has component connection terminals and covers a top surface of the first core member. The electronic components are housed in the cavities and are electrically connected to the top wiring layer.

A surface mounted component that connects to the component connection terminals is mounted on the top surface of the top wiring layer. This configuration allows for the number of stacked wiring layers belonging to the top wiring layer to be reduced, which makes it possible to shorten the wiring path between the surface mounted component and the electronic components in the cavities, thereby improving the device characteristics of the surface mounted component, for example.

The first wiring substrate may further include a bottom wiring layer between the first core member and the bonding layer, and the patterned conductive layer may be connected to at least a pattern of the bottom wiring layer of the first wiring substrate.

The second wiring substrate may further include a top wiring layer between the second core member and the bonding layer, and the patterned conductive layer may be connected to at least a pattern of the top wiring layer of the second wiring substrate.

The bonding layer may include: a third wiring substrate; a first bonding layer on a top surface of the third wiring substrate to bond the first wiring substrate to the third wiring substrate; and a second bonding layer on a bottom surface of the third wiring substrate to bond bonds the second wiring substrate to the third wiring substrate.

The bonding layer may have interlayer connection sections that electrically connect the first wiring substrate to the second wiring substrate.

The bonding layer may have a multilayer structure of a plurality of bonding materials having differing degrees of hardness. A multilayer member in which the second bonding materials that are softer than the first bonding material sandwich the first bonding material can form the above-mentioned bonding layer, for example. This can prevent unintentional electrical shorting among the wiring layers of the respective first and second wiring substrates, which face each other across the bonding layer.

It should be noted that the bonding layer may have an insulating fiber layer therein. This makes it possible to obtain effects similar to those described above.

As described above, in at least one aspect, the present invention makes it possible to obtain a multilayer wiring substrate that can reduce the adverse effects caused by increasing the number of wiring layers.

It is to be understood that both the foregoing general description and the following detailed description are exemplary and explanatory, and are intended to provide further explanation of the invention as claimed.

DETAILED DESCRIPTION OF EMBODIMENTS

Embodiments of the present invention will be described below with reference to the drawings.

Embodiment 1

Figure 1A:
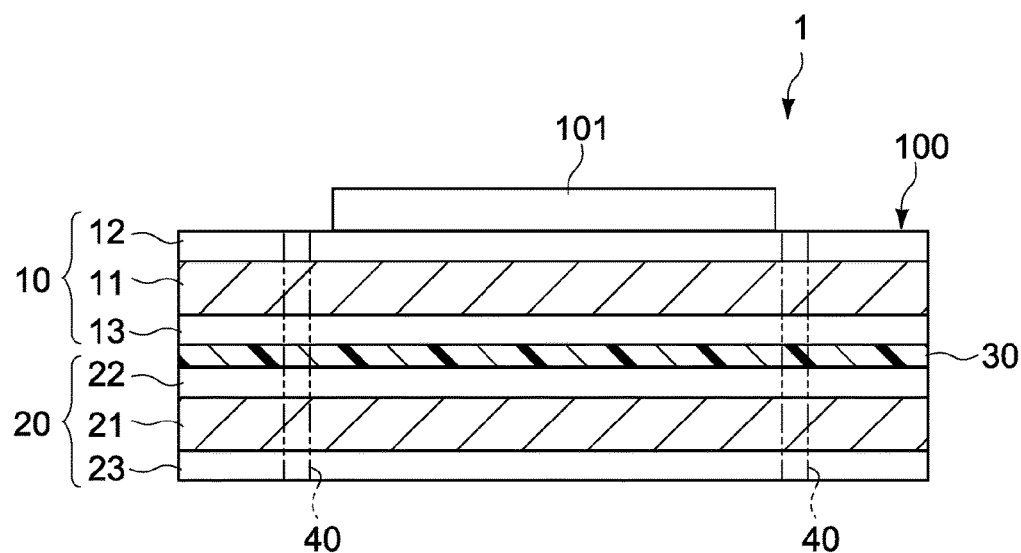
FIG. 1A is a cross-sectional view that schematically shows one configuration example of an electronic device having a multilayer wiring substrate according to one embodiment of the present invention.
Figure 2:
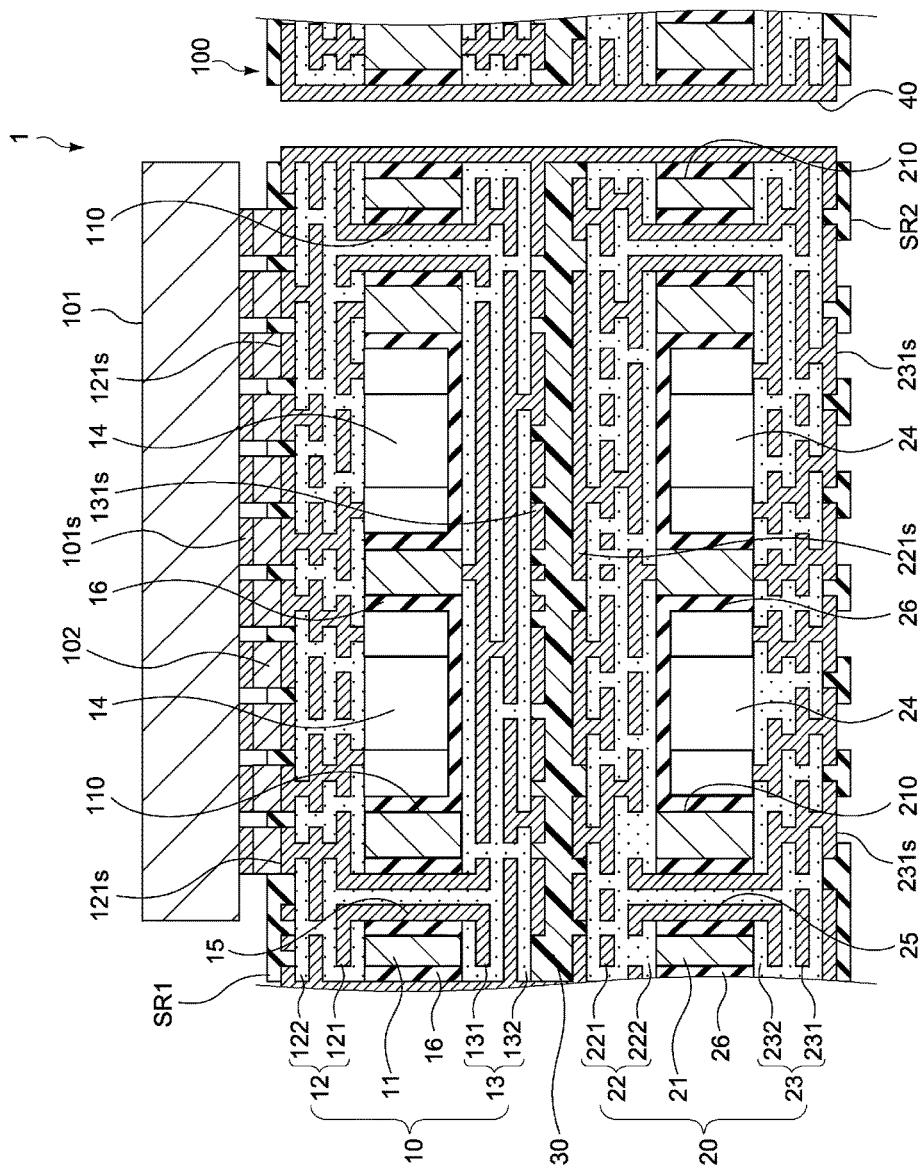
FIG. 2 is a magnified cross-sectional view of important parts showing the internal structure of the multilayer wiring substrate in FIG. 1A.

FIG. 1A is a schematic cross-sectional view of an electronic device 1 having a multilayer wiring substrate 100 and a surface mounted component 101 on the substrate according to one embodiment of the present invention. FIG. 2 is a magnified cross-sectional view showing important parts of the inner structure of the multilayer wiring substrate 100.

(Multilayer Wiring Substrate)

The multilayer wiring substrate 100 of the present embodiment has a first wiring substrate 10, a second wiring substrate 20, and a bonding layer 30. The multilayer wiring substrate 100 has a thickness of 1 mm to 2 mm, for example. The multilayer wiring substrate 100 is formed as an interposer substrate that connects the surface mounted component 101 to a control substrate (motherboard).

Figure 1B:
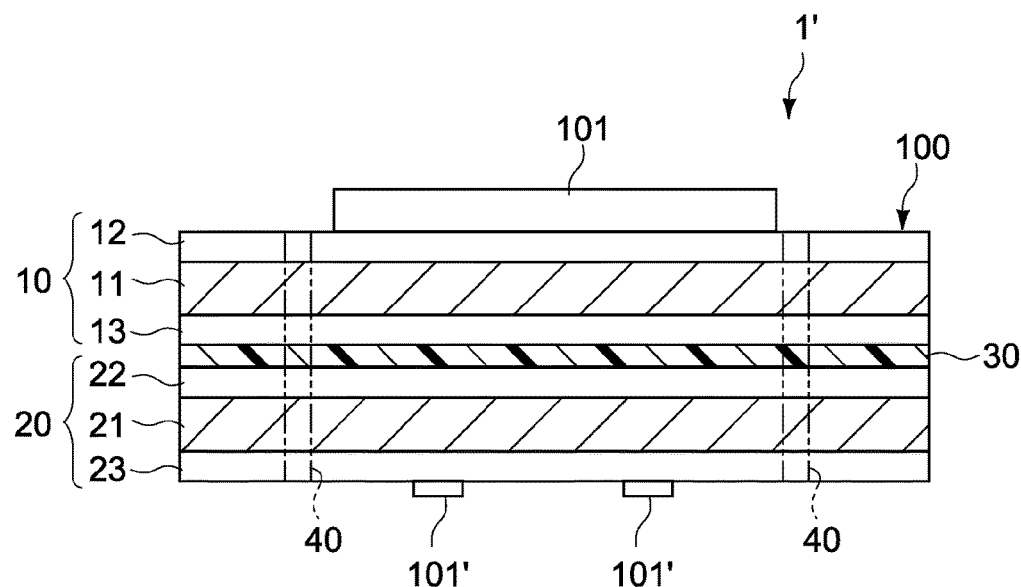
FIG. 1B is a cross-sectional view that schematically shows another configuration example of the electronic device having the multilayer wiring substrate.

It should be noted that, as shown in FIG. 1B, the multilayer wiring substrate 100 may be formed as a double-sided circuit substrate having surface mounted components 101 and 101' on each of these sides. In such a case, the surface mounted components 101' may be more compact or thinner than the surface mounted component 101, for example.

The first wiring substrate 10 has a first core member 11, a top wiring layer 12 (first wiring layer) covering the front surface (top surface in the drawing) of the first core member 11, and a bottom wiring layer 13 (second wiring layer) covering the rear surface (bottom surface in the drawing) of the first core member 11.

In a similar manner, the second wiring substrate 20 has a second core member 21, a top wiring layer 22 (third wiring layer) covering the front surface (top surface in the drawing) of the second core member 21, and a bottom wiring layer 23 (fourth wiring layer) covering the rear surface (bottom surface in the drawing) of the second core member 21.

(Core Member)

The first and second core members 11 and 21 are respectively made of metal base materials having a plate shape in a plan view. The first and second core members 11 and 21 are made of a metal material that has a relatively high rigidity and heat dissipation and are typically formed with copper plates of a prescribed thickness (100 μm to 500 μm, for example).

The first and second core members 11 and 21 each have a plurality of cavities 110 and 210 therein. The cavities 110 and 210 are formed at a size that is capable of housing embedded components 14 and 24 or vias 15 and 25. The cavities 110 and 210 are typically constituted by bottomless holes that penetrate the first and second core members 11 and 21, but may be constituted by bottomed holes instead.

The first and second core members 11 and 21 are each connected to a ground line. The first and second core members 11 and 21 are not limited to sharing the same ground line, and each may be connected to a separate ground line. The first core member 11 is connected to a digital circuit ground line and the second core member 21 is connected to an analog circuit ground line, for example. This makes it possible to prevent the digital circuit and analog circuit from influencing each other, which ensures proper operation of the circuits.

The embedded components 14 and 24 are electric/electronic components such as capacitors, inductors, resistors, filter chips, ICs, or the like, for example. The embedded components 14 housed inside the cavities 110 are electrically connected to the top wiring layer 12 of the first wiring substrate 10. Meanwhile, the embedded components 24 housed in the cavities 210 are electrically connected to the bottom wiring layer 23 of the second wiring substrate 20.

Electrically-insulating resin materials 16 and 26 are respectively interposed between the embedded components 14, 24 and the inner surfaces of the cavities 110, 210, and this prevents electrical shorts between the respective embedded components 14, 24 and second core members 11, 21. The resin material 16 is also interposed in the cavities 110 between the embedded components 14 and the bottom wiring layer 13 of the first wiring substrate 10, and this electrically insulates the embedded components 14 from the bottom wiring layer 13. In a similar manner, the resin material 26 is also interposed in the cavities 210 between the embedded components 24 and the top wiring layer 22 of the second wiring substrate 20, and this electrically insulates the embedded components 24 from the top wiring layer 22.

The vias 15 and 25 are electrically insulated from the inner surface of the respective cavities 110 and 210 by the resin materials 16 and 26. The via 15 housed inside the cavity 110 electrically connects the top wiring layer 12 of the first wiring substrate 10 to the bottom wiring layer 13. Meanwhile, the via 25 housed inside the cavity 210 electrically connects the top wiring layer 22 of the second wiring substrate 20 to the bottom wiring layer 23.

(Wiring Layer)

The top wiring layer 12 of the first wiring substrate 10 has a multilayer wiring structure in which a plurality of wiring sections 121 are stacked on each other via an insulating film 122 on the top of the first core member 11. In the present embodiment, the top wiring layer 12 has three layers of the wiring sections 121, but the number of layers is not limited to this. A portion of the bottommost layer of the wiring section 121 is connected to the first core member 11, electrode part of the embedded components 14, and the via 15. A portion of the uppermost layer of the wiring section 121 forms component connection terminals 121s that are electrically connected to the surface mounted component 101. The respective wiring sections 121 are connected to each other at suitable locations, and wiring paths are formed to connect the terminals of the surface mounted component 101 to the first core member 11, embedded components 14, via 15, and the like, for example.

The bottom wiring layer 13 of the first wiring substrate 10 has a multilayer wiring structure in which a plurality of wiring sections 131 are stacked on each other via an insulating film 132 on the bottom of the first core member 11. In the present embodiment, the bottom wiring layer 13 has three layers of the wiring sections 131 connected to each other at suitable locations. In FIG. 2, a portion of the uppermost layer of the wiring section 131 is connected to the first core member 11 or the via 15, and the bottommost wiring section 131 forms a portion of a conductive layer 131s disposed inside the bonding layer 30.

The top wiring layer 22 of the second wiring substrate 20 has a multilayer wiring structure in which a plurality of wiring sections 221 are stacked on each other via an insulating film 222 on the top of the second core member 21. In the present embodiment, the top wiring layer 22 has three layers of the wiring sections 221 connected to one another at suitable locations, but the number of layers is not limited to this. A portion of the bottommost wiring section 221 is connected to the second core member 21 and the via 25, and the uppermost wiring section 221 forms a portion of a conductive layer 221s disposed inside the bonding layer 30.

The bottom wiring layer 23 of the second wiring substrate 20 has a multilayer wiring structure in which a plurality of wiring sections 231 are stacked on one another via an insulating film 232 on the bottom of the second core member 21. In the present embodiment, the bottom wiring layer 23 has three layers of the wiring sections 231 connected to one another at suitable locations, but the number of layers is not limited to this. In FIG. 2, a portion of the uppermost wiring section 231 is connected to the first core member 21, electrode part of the embedded components 24, and the via 25. A portion of the bottommost wiring section 231 forms external connection terminals 231s that electrically connect to a mounting substrate (not shown).

The respective wiring sections 121, 131, 221, and 231 are conductive patterns formed by patterning conductive layers made of copper, aluminum, or the like into prescribed shapes, for example. The respective wiring sections 121, 131, 221, and 231 are made of metal foil that is thinner than the first and second core members 11, 21, and these wiring sections function as signal lines or ground lines that connect the surface mounted component 101 to the respective embedded components 14 and 24 or to the control substrate. The thickness of the wiring sections 121, 131, 221, and 231 has no particular limitations, and is 10 μm to 15 μm, for example.

The insulating layers 122, 132, 222, and 232 are made of an insulating synthetic resin material such as a BT resin (bismaleimide-triazine resin), a glass epoxy-based material, or the like, for example. The thickness of the insulating layers 122, 132, 222, and 232 has no particular limitations, and is 10 μm to 50 μm, for example.

The respective wiring layers 12, 13, 22, and 23 are fabricated on the first and second core members 11 and 21 using the build-up method or the like. A protective film (solder resist) SR1 is formed on the surface of the top wiring layer 12 of the first wiring substrate 10, and the component connection terminals 121s are exposed to the outside via an aperture formed in the protective film SR1. In a similar manner, a protective film (solder resist) SR2 is formed on the surface of the bottom wiring layer 23 of the second wiring substrate 20, and the external connection terminals 231s are exposed to the outside via an aperture formed in the protective film SR2.

(Bonding Layer)

The bonding layer 30 is disposed between the first wiring substrate 10 and the second wiring substrate 20 and bonds these substrates together. The bonding layer 30 is made of an electrically insulating adhesive material or pressure-sensitive adhesive material, and in the present embodiment, the bonding layer is made of a thermosetting resin material such as an epoxy resin. The thickness of the bonding layer 30 has no particular limitations, and is 40 μm, for example.

The bonding layer 30 respectively covers the conductive layer 131s that forms the bottommost wiring section 131 of the bottom wiring layer 13 of the first wiring substrate 10 and the conductive layer 221s that forms the uppermost wiring section 221 of the top wiring layer 22 of the second wiring substrate 20. Accordingly, by immersing the conductive layers 131s and 221s into the bonding layer 30 and interposing the bonding layer 30 between the respective conductive layers 131s and 221s, electrical shorting among these layers is prevented.

It should be noted that, as described later, the bonding layer 30 may be constituted by a multilayer member of a plurality of bonding materials with differing degrees of elasticity, or may be constituted by a sheet material having insulating fiber layers such as glass fibers or the like.

The multilayer wiring substrate 100 of the present embodiment is fabricated by bonding the first wiring substrate 10 to the second wiring substrate 20 via the bonding layer 30. Accordingly, the first wiring substrate 10 and the second wiring substrate 20 can each be fabricated independently, which allows for simplification of the manufacturing process and an improvement in yield.

(Other)

The multilayer wiring substrate 100 further includes through-holes 40 that penetrate the front and rear of the substrate. The through-holes 40 penetrate the multilayer wiring substrate 100 and electrically connect the uppermost wiring section 121 of the top wiring layer 12 of the first wiring substrate 10 to the bottommost wiring section 231 of the bottom wiring layer 23 of the second wiring substrate 20. In the present embodiment, the through-holes 40 are constituted by through-hole plating in which copper plating, for example, is applied to the inner wall faces of the penetrating holes that go through the multilayer wiring substrate 100, but the through-holes are not limited to this; a conductive material may be filled into these penetrating holes, or a resin material may be filled inside the through-hole plating. Furthermore, the through-holes 40 may be connected to other wiring sections further inside the layers, rather than only the wiring sections 121 and 232 of the uppermost layer and the bottommost layer. The number of through-holes 40 has no particular limitations, and the formation location also has no particular limitations.

The surface mounted component 101 is a semiconductor IC (integrated circuit) component, light-emitting device, imaging device, or the like, for example. The IC component may be a semiconductor bare chip, or may be a package component. The surface mounted component 101 has a plurality of external terminals 101s on a face thereof facing the surface of the multilayer wiring substrate 100 and is electrically and mechanically connected to the component connection terminals 121s via a bonding part such as solder paste, a solder ball, a plating bump, etc. The mounting example of the surface mounted component 101 is not limited to the flip chip method, and a wire bonding method may be used instead.

(Effects of Multilayer Wiring Substrate)

As described above, the multilayer wiring substrate 100 of the present embodiment has a multilayer structure constituted by the first wiring substrate 10 that includes the first core member 11 and the second wiring substrate 20 that includes the second core member 21. By increasing the layers of the core members 11 and 21, it is possible to arrange the wiring layers 12, 13, 22, and 23 on both surfaces of the respective core members 11 and 21. Therefore, it is possible to secure the number of wiring layers while shortening the wiring paths among the components, and thus possible to ensure stability of the desired device characteristics. Furthermore, increasing the layers of the core members 11 and 21 allows for the rigidity and heat dissipation characteristics of the substrate to be improved further.

Figure 3:
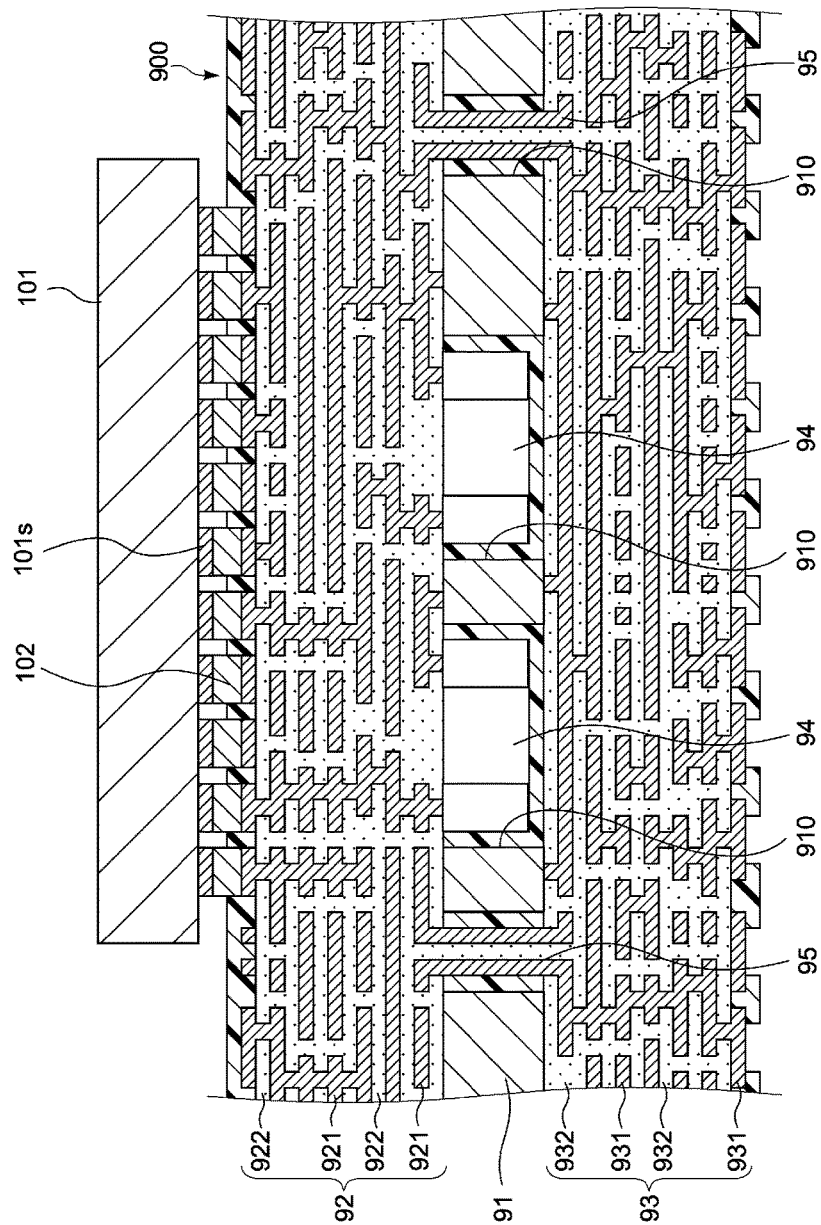
FIG. 3 is a cross-sectional view of important parts showing the internal structure of the multilayer wiring substrate in a comparison example.

FIG. 3 shows a configuration example of a multilayer wiring substrate of a comparison example. This multilayer wiring substrate 900 has a configuration in which a top wiring layer 92 and a bottom wiring layer 93 are respectively stacked on the top and bottom of a single core member 91. The core member 91 is made of a metal base material and has a plurality of cavities 910 that can house embedded components 94 and vias 95. The top wiring layer 92 has a multilayer wiring structure in which a plurality of wiring sections 921 are stacked on one another via insulating films 922, and the bottom wiring layer 93 also has a multilayer wiring structure in which a plurality of wiring sections 931 are stacked on one another via insulating films 932.

To increase the number of wiring layers in this type of multilayer wiring substrate 900 according to the comparison example, the respective wiring sections 921 and 931 of the top wiring layer 92 and the bottom wiring layer 93 need to be multilayer structures.

In such a case, in the top wiring layer 92, it is not possible to avoid lengthening the wiring distance between the surface mounted component 101 and the core member 91 and the embedded component 94 therein. Thus, if the surface mounted component 101 is a semiconductor IC component and the embedded components 94 are bypass capacitors connected to the surface mounted component 101, it will be difficult to ensure the desired device characteristics of the surface mounted component 101. Furthermore, if the surface mounted component 101 is a heat-generating component such as a light-emitting device or the like, the heat dissipation route to the core member 91 will become longer, which will make it difficult to ensure stable light-emitting characteristics. In a similar manner for the bottom wiring layer 93, the wiring path between the mounting substrate and the surface mounted component 101 or the embedded component 94 makes it difficult to ensure the desired device characteristics.

Furthermore, increasing the number of layers of the wiring sections 921 and 931 of the top wiring layer 92 and the bottom wiring layer 93 increases the thickness of these wiring layers 92 and 93, and internal stress exceeding the rigidity of the core member 91 could make it difficult to maintain flatness of the entire substrate due to warping, deflecting, or the like of the substrate.

As a countermeasure, the multilayer wiring substrate 100 of the present embodiment includes a plurality of core members 11 and 21; therefore, it is possible to decrease the number of stacked layers of the wiring sections on the core member in regards to the respective wiring layers 12, 13, 22, and 23 without decreasing the total number of stacked layers of the wiring sections. This makes it possible to shorten the wiring paths between the surface mounted component 101 and the embedded components 14, which allows for a plurality of bypass capacitors to be efficiently arranged directly under or near the surface mounted component 101 as the embedded components 14, for example.

It should be noted that, in the example shown in FIG. 2, the positions of the respective vias (interlayer connecting sections) that form the wiring paths connecting the electrode part of the embedded components 14 to the outer terminals 101s of the surface embedded component 101 are offset from one another, but the present invention is not limited to this; the respective vias may be arranged so as to correspond in position to one another. This allows for the wiring paths that connect the electrode part of the embedded components 14 to the outer terminals 101s of the surface mounted component to be made as short as possible. Moreover, the respective vias are not limited to connecting the wiring lines of the abutting two layers, and may directly connect to the desired wiring layers without going through any intermediate wiring layers, for example.

In addition, due to it being possible to shorten the wiring length between the surface mounted component 101 and the first core member 11, the heat dissipating characteristics of the surface mounted component 101 can be enhanced. In this manner, signal rounding or heat dissipating defects of the surface mounted component 101 can be suppressed to ensure stable and desired device characteristics with ease.

Providing the plurality of core members 11 and 21 also increases rigidity of the entire substrate, which allows for suppression of deformations of the substrate such as warping or deflection.

Furthermore, according to the present embodiment, due to providing the conductive layers 131s and 221s inside the bonding layer 30, these conductive layers 131s and 221s can be used as a part of the wiring in order to enhance circuit design freedom and to contribute to further increasing the number of wiring layers.

Embodiment 2

Figure 4:
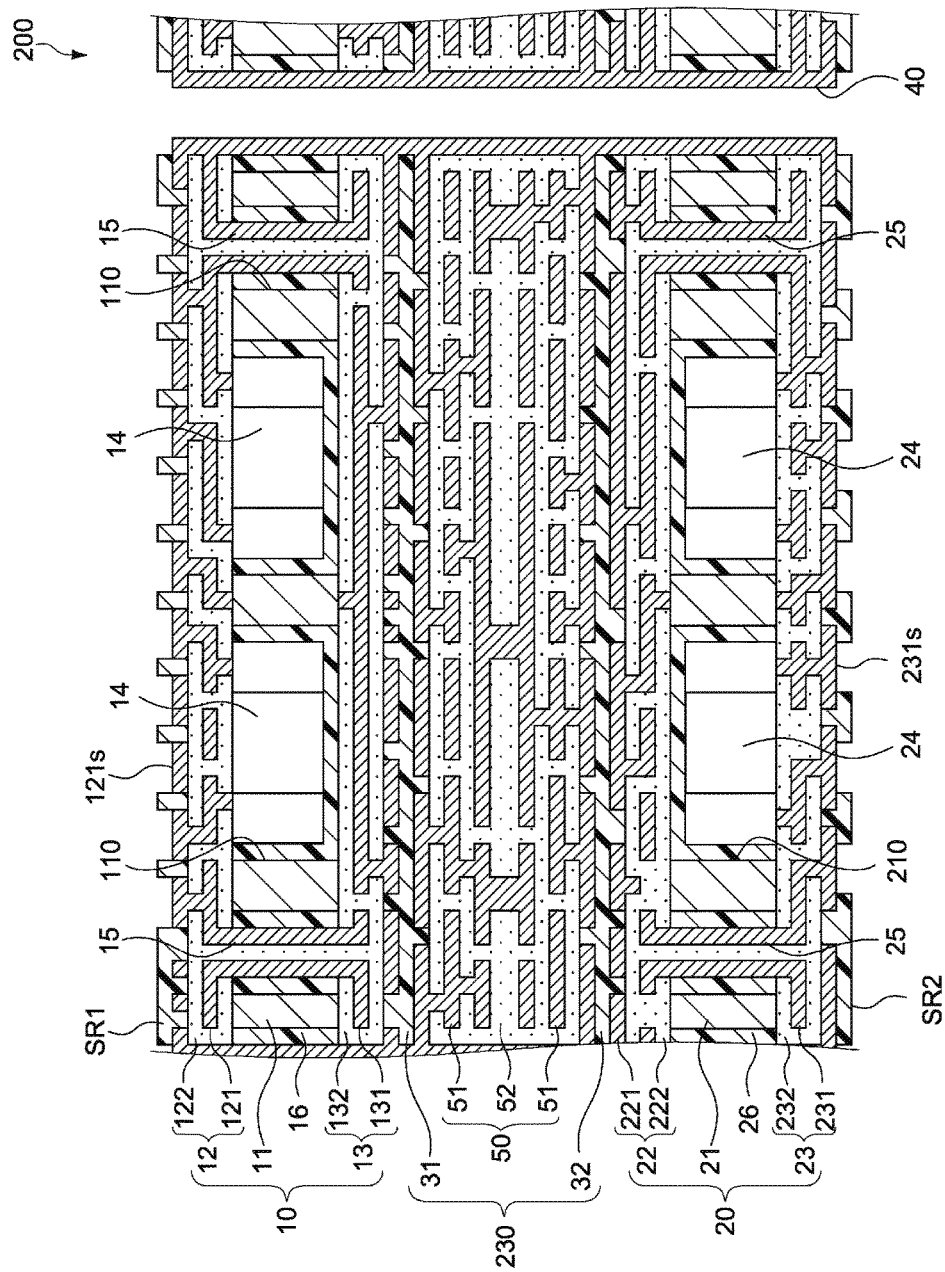
FIG. 4 is a cross-sectional view showing a configuration of a multilayer wiring substrate according to Embodiment 2 of the present invention.

FIG. 4 is a cross-sectional view showing a configuration of a multilayer wiring substrate according to Embodiment 2 of the present invention. The configurations of Embodiment 2 differing from Embodiment 1 will mainly be described below, and the same reference characters will be given to the components that are the same as Embodiment 1 described above; thus, repetitive explanations will be omitted or simplified.

A multilayer wiring substrate 200 of the present embodiment includes a first wiring substrate 10, a second wiring substrate 20, a bonding layer 230 provided between the first wiring substrate 10 and the second wiring substrate 20, and a third wiring substrate 50 inside the bonding layer 230.

The bonding layer 230 has a first bonding layer 31 and a second bonding layer 32. The first bonding layer 31 is provided between the first wiring substrate 10 and the third wiring substrate 50 and is formed of an electrically-insulating bonding material that bonds the first wiring substrate and third wiring substrate together. The second bonding layer 32 is provided between the second wiring substrate 20 and the third wiring substrate 50 and is formed of an electrically-insulating bonding material that bonds the second wiring substrate and third wiring substrate together.

The third wiring substrate 50 is formed as a conductive layer provided inside the bonding layer 230. The third wiring substrate 50 has a multilayer wiring structure in which a plurality of wiring sections 51 are stacked via an insulating film 52. In the present embodiment, the third wiring substrate 50 has a multilayer structure of six layers in which the respective wiring sections 51 are connected at suitable locations, but the number of layers of the wiring sections 51 is not limited to this.

The multilayer wiring substrate 200 of the present embodiment includes the third wiring layer substrate 50, which has a multilayer wiring structure inside the bonding layer 230; thus, it is possible to increase the number of layers of the wiring sections at a relatively low cost.

Furthermore, according to the present embodiment, the third wiring substrate 50 is provided inside the bonding layer 230, which makes it possible for a portion of the wiring sections of the first wiring substrate 10 and/or the second wiring substrate 20 to be concentrated on the third wiring substrate 50. In Embodiment 1, for example, the respective wiring layers 12, 13, 22, and 23 of the first and second wiring substrates 10 and 20 were formed of three layers of wiring sections, but in the present embodiment, each are formed of wiring sections with two layers. This makes it possible to further reduce the wiring length between the surface embedded component 101 and the embedded components 14 or first core member 11, or the wiring length between the mounting substrate on which the multilayer wiring substrate 200 is mounted and the embedded components 24 or the second core member 21.

Embodiment 3

Figure 5:
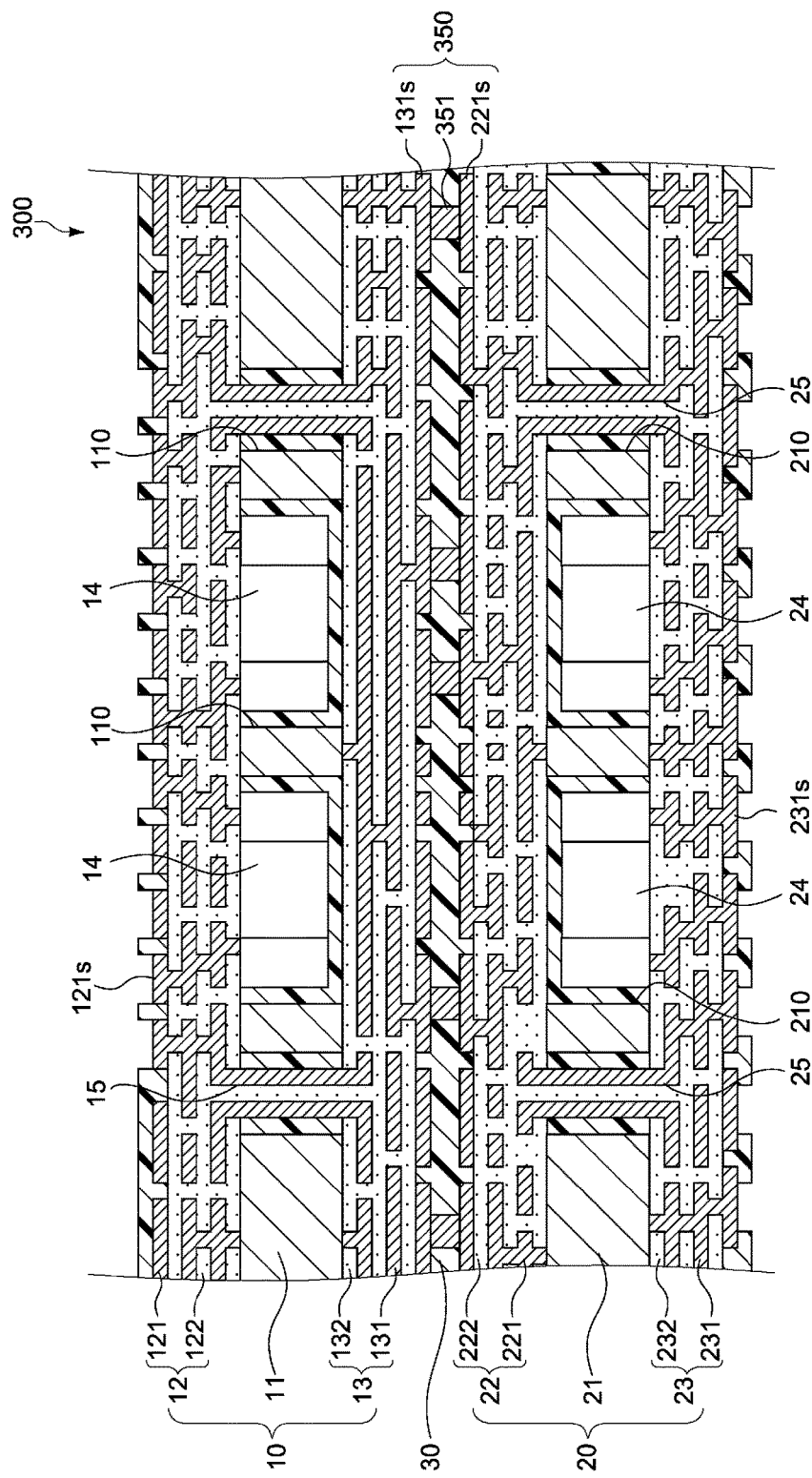
FIG. 5 is a cross-sectional view showing a configuration of a multilayer wiring substrate according to Embodiment 3 of the present invention.

FIG. 5 is a cross-sectional view showing a configuration of a multilayer wiring substrate according to Embodiment 3 of the present invention. The configurations of Embodiment 3 differing from Embodiment 1 will mainly be described below, and the same reference characters will be given to the components that are the same as Embodiment 1 described above; thus, repetitive explanations will be omitted or simplified.

A multilayer wiring substrate 300 of the present embodiment includes a first wiring substrate 10, a second wiring substrate 20, a bonding layer 30 provided between the first wiring substrate 10 and the second wiring substrate 20, and a conductive layer 350 inside the bonding layer 30.

The conductive layer 350 has a wiring section 131s provided in the bottommost layer of the first wiring substrate 10, a wiring section 221s provided in the uppermost layer of the second wiring substrate 20, and interlayer connection sections 351 that connect the wiring sections 131s and 221s to one another at suitable locations. In other words, the interlayer connection sections 351 function to connect electrically the first wiring substrate 10 to the second wiring substrate 20.

The wiring sections 131s and 221s are made of conductive patterns formed by patterning a metal foil such as a copper foil into a prescribed shape, as described above. These wiring sections 131s and 221s are respectively embedded in the front surface and rear surface of the bonding layer 30.

The interlayer connection sections 351 are made of a conductive material that penetrates the bonding layer 30 at a suitable location. The interlayer connection sections 351 are typically a hardened material of conductive paste filled into a through-hole formed in the bonding layer 30; a protrusion formed in the wiring section 131s or the wiring section 221s and penetrating the bonding layer 30; or the like.

The multilayer wiring substrate 300 of the present embodiment makes it possible to obtain effects similar to those of Embodiment 1 described above. In particular, the present embodiment makes it possible to connect electrically the first wiring substrate 10 and the second wiring substrate 20 to one another via the bonding layer 30; thus, this can improve circuit design freedom.

In addition, according to the present embodiment, the conductive layer 350 provided inside the bonding layer 30 has the interlayer connection sections 351; therefore, it is possible to ensure electrical connection of the first and second wiring substrates 10 and 20 to one another without needing through-holes penetrating the front and rear of the substrate.

Embodiment 4

Figure 6:
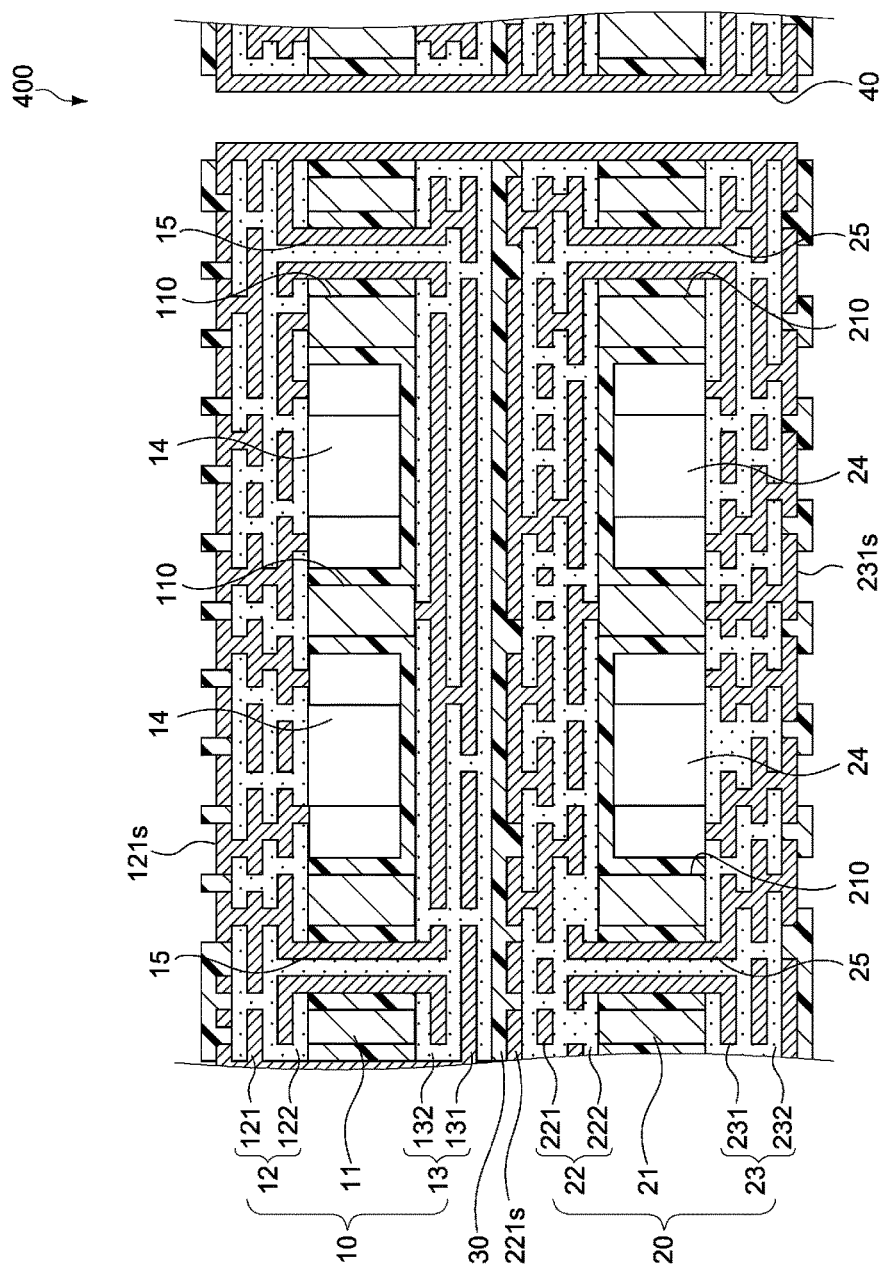
FIG. 6 is a cross-sectional view showing a configuration of a multilayer wiring substrate according to Embodiment 4 of the present invention.

FIG. 6 is a cross-sectional view showing a configuration of a multilayer wiring substrate according to Embodiment 4 of the present invention. The configurations of Embodiment 4 differing from Embodiment 1 will mainly be described below, and the same reference characters will be given to the components that are the same as Embodiment 1 described above; thus, repetitive explanations will be omitted or simplified.

A multilayer wiring substrate 400 of the present embodiment includes a first wiring substrate 10, a second wiring substrate 20, a bonding layer 30 provided between the first wiring substrate 10 and the second wiring substrate 20, and a wiring section 221s as a conductive layer inside the bonding layer 30.

Embodiment 4 differs from Embodiment 1 in that a conductive layer provided inside the bonding layer 30 is only constituted by the wiring section 221s on the uppermost layer of the second wiring substrate 20. In the present embodiment, the bottommost wiring section 131 of the first wiring substrate 10 is covered by an insulating film 132, and the first wiring substrate 10 is bonded to the bonding layer 30 via the insulating film 132.

According to the present embodiment, the conductive layer provided inside of the bonding layer 30 is only constituted by the wiring section 221s; therefore, it is possible to prevent electrical shorting between the wiring section 131 and the wiring section 221 while reducing the thickness of the bonding layer 30. This allows for the multilayer wiring substrate 400 to be made thinner.

It should be noted that, in the present embodiment, the conductive layer described above is only constituted by the wiring section 221s provided on the uppermost layer of the second wiring substrate 20, but alternatively, the conductive layer described above may be only constituted by the wiring section 131s (see FIG. 2) provided on the bottommost layer of the first wiring substrate 10. An effect similar to those described above can also be obtained in this case.

Embodiment 5

Figure 7:
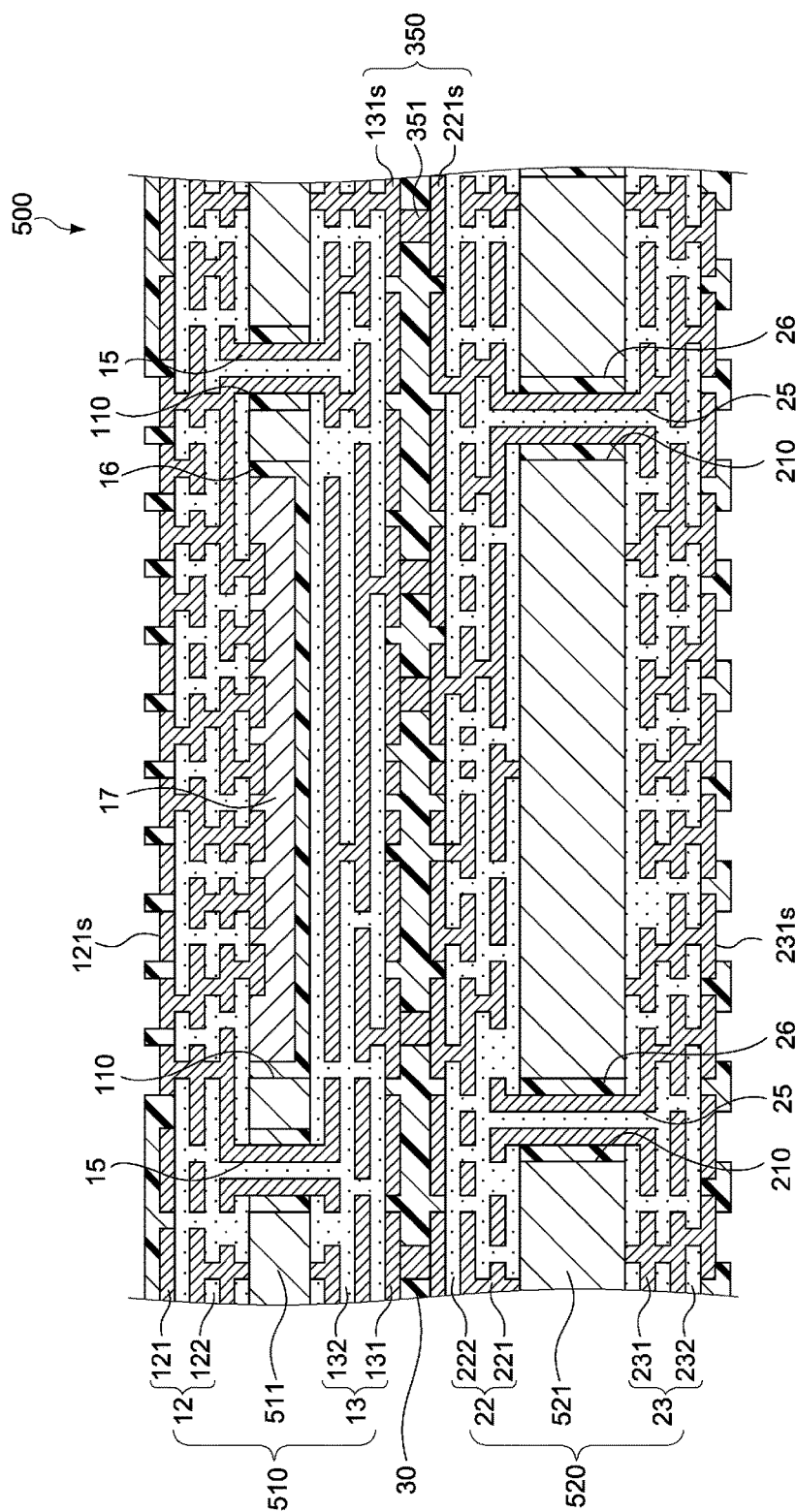
FIG. 7 is a cross-sectional view showing a configuration of a multilayer wiring substrate according to Embodiment 5 of the present invention.

FIG. 7 is a cross-sectional view showing a configuration of a multilayer wiring substrate according to Embodiment 5 of the present invention. The configurations of Embodiment 5 differing from Embodiment 1 will mainly be described below, and the same reference characters will be given to the components that are the same as Embodiment 1 described above; thus, repetitive explanations will be omitted or simplified.

A multilayer wiring substrate 500 of the present embodiment includes a first wiring substrate 510, a second wiring substrate 520, a bonding layer 30 provided between the first wiring substrate 510 and the second wiring substrate 520, and a conductive layer 350 inside the bonding layer 30.

It should be noted that the bonding layer 30 and the conductive layer 350 are similar to Embodiment 3 described above, and an explanation thereof will not be repeated here.

The first wiring substrate 510 has a first core member 511, a top wiring layer 12, and a bottom wiring layer 13.

The first core member 511 is made of a metal base material (a copper base material, for example) at a prescribed thickness and has a plurality of cavities 110 that can house embedded components 17 vias 15 for connecting the top wiring layer 12 to the bottom wiring layer 13. The embedded components 17 are embedded inside a resin material 16 that is filled into the cavities 110, and the plurality of terminals arrayed on top of the embedded components 17 are electrically connected to the top wiring layer 12.

The top wiring layer 12 and the bottom wiring layer 13 have a similar multilayer wiring structure as described in Embodiment 1.

The second wiring substrate 520 has a second core member 521, a top wiring layer 22, and a bottom wiring layer 23.

The second core member 521 is made of a metal base material (a copper base material, for example) at a prescribed thickness and has a plurality of cavities 210 that can house vias 25 for connecting the top wiring layer 22 to the bottom wiring layer 23. In the present embodiment, the second core member 521 is formed at a greater thickness than the first core member 511.

The top wiring layer 22 and the bottom wiring layer 23 have a similar multilayer wiring structure to that as described in Embodiment 1.

The components used as the embedded components 17 housed in the cavities 110 are mainly made of a material that has a higher or lower linear coefficient of expansion than the resin material and the first core member 511, which is made of copper. The components used as the embedded components 17 may also have a relatively large area. An example of such a component is a silicon bare chip or the like. In such a case, the volume, occupancy, and the like of the respective materials constituting the first core member 511, resin material 16, embedded components 17, wiring layers 12, 13, and the like may aggravate deflection of the first wiring substrate 510.

As a countermeasure, in the present embodiment, the second core member 521 is formed at a greater thickness than the first core member 511. This reinforces the first wiring substrate 510 and allows for suppression of deflection. Accordingly, it is possible to fabricate the multilayer wiring substrate 500 at a high degree of flatness regardless of the size or type of embedded components 17 housed in the first core member 511.

In order to enhance rigidity of the second core member 521, the number and size of the cavities 210 may be restricted in addition to increasing the thickness of the second core member. In the present embodiment, only the cavities 210 for housing the vias 25 may be formed in the second core member 521, for example.

Embodiment 6

Figure 8:
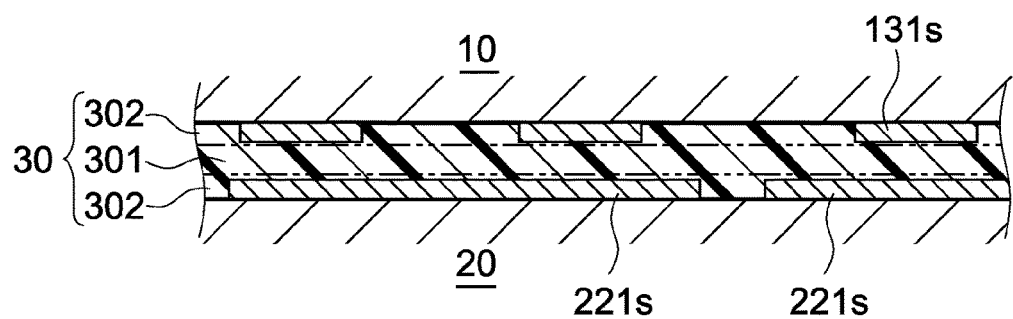
FIG. 8 is a schematic cross-sectional view showing a configuration of important parts of a multilayer wiring substrate according to Embodiment 6 of the present invention.
Figure 9:
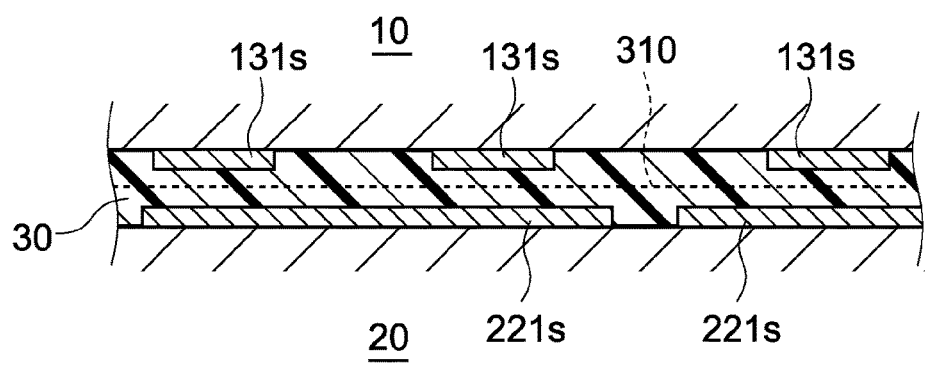
FIG. 9 is a schematic cross-sectional view showing another configuration of important parts of a multilayer wiring substrate according to Embodiment 6 of the present invention.

FIGS. 8 and 9 are cross-sectional views showing configurations of important parts of a multilayer wiring substrate according to Embodiment 7 of the present invention. The configurations of Embodiment 6 differing from Embodiment 1 will mainly be described below, and the same reference characters will be given to the components that are the same as Embodiment 1 described above; thus, repetitive explanations will be omitted or simplified. It should be noted that the structure of the bonding layer 30 shown in FIG. 8 and FIG. 9 can be applied to all of the respective embodiments described above.

The embodiment in FIG. 8 shows an example in which the bonding layer 30 that bonds the first wiring substrate 10 to the second wiring substrate 20 is formed of a multilayer member having a plurality of bonding materials with differing hardness. The bonding layer 30 is formed such that a first bonding material 301 is sandwiched between a pair of second bonding materials 302. The first bonding material 301 is made of a material that is harder than the second bonding material 302. The material for forming the first and second bonding materials 301 and 302 has no particular limitations, and it is possible to use a polyimide or resin containing glass cloth for the first bonding material 301 and an epoxy resin or cyanate resin for the second bonding material, for example.

This makes it possible to prevent unintentional electrical shorts between the wiring sections 131s and 221s of the first and second wiring substrates, which face each other across the bonding layer 30.

The embodiment in FIG. 9 shows an example in which the bonding layer 30 that bonds the first wiring substrate 10 to the second wiring substrate 20 is made of a sheet material having an insulating fiber layer 310 therein. The fiber layer 310 can typically be a woven fabric material such as glass cloth or aramid fiber, and impregnating these in the resin material constituting the bonding layer 30 makes it possible to fabricate the bonding layer 30.

The bonding layer 30 having the insulating fiber layer 310 therein makes it possible to prevent unintentional electrical shorts between the wiring section 131s and the wiring section 221s while keeping the thickness of the bonding layer 30 as small as possible Embodiments of the present invention were described above, but the present invention is not limited to the above-mentioned embodiments, and various modifications can be made.

In the respective embodiments above, a configuration was described in which the first core members 11 and 511 have cavities 110 for housing the embedded components 14 and 17, but the cavities may have only the resin material 16 filled therein without housing the embedded components 14 and 17, for example. In addition, the second core members 21 and 521 may be made of a block-shaped metal base material that does not have cavities.

Moreover, the multilayer wiring substrate described in the above-mentioned embodiments is an interposer substrate that connects a surface mounted component to a control substrate, but the present invention is not limited to this, and the multilayer wiring substrate may be a motherboard, a supporting substrate for various types of package components, or the like.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded as within the scope of the present invention.

What is claimed is:

1. A multilayer wiring substrate, comprising:
   a first wiring substrate having a first core member made of metal with cavities therein;
   a second wiring substrate having a second core member made of metal; and
   a bonding layer between the first wiring substrate and the second wiring substrate to bond a bottom surface of the first wiring substrate to a top surface of the second wiring substrate, the bonding layer having a first patterned conductive layer on a top surface thereof and a second patterned conductive layer on a bottom surface thereof,
   wherein the first wiring substrate further comprises a top wiring layer having component connection terminals and covering a top surface of the first core member, the top wiring layer having a multilayer wiring structure in which a plurality of wiring sections are stacked on each other via an insulating film in between on the top of the first core member,
   wherein electronic components are housed in the respective cavities and electrically connected to the top wiring layer,
   wherein the first wiring substrate further comprises a bottom wiring layer between the first core member and the bonding layer, connected to the first patterned conductive layer of the bonding layer, the bottom wiring layer having a multilayer wiring structure in which a plurality of wiring sections are stacked on each other via an insulating film in between on the bottom of the first core member,
   wherein the second wiring substrate further comprises a top wiring layer between the second core member and the bonding layer, connected to the second patterned conductive layer of the bonding layer, the top wiring layer having a multilayer wiring structure in which a plurality of wiring sections are stacked on each other via an insulating film in between on the top of the second core member, and
   wherein the second wiring substrate further comprises a bottom wiring layer between the second core member and the bonding layer, the bottom wiring layer having a multilayer wiring structure in which a plurality of wiring sections are stacked on each other via an insulating film in between on the bottom of the second core member.

2. The multilayer wiring substrate according to claim 1, wherein the bonding layer comprises:
   a third wiring substrate having a multilayer wiring structure in which a plurality of wiring sections are stacked via an insulating film therebetween;
   a first bonding layer on a top surface of the third wiring substrate to bond the first wiring substrate to the third wiring substrate, the first bonding layer including said first patterned conductive layer on a top surface thereof; and
   a second bonding layer on a bottom surface of the third wiring substrate to bond the second wiring substrate to the third wiring substrate, the second bonding layer including said second patterned conductive layer on a bottom surface thereof.

3. The multilayer wiring substrate according to claim 1, wherein the bonding layer has interlayer connection sections that electrically connect the first wiring substrate to the second wiring substrate.

4. The multilayer wiring substrate according to claim 1, wherein the bonding layer has a multilayer structure of a plurality of bonding materials having differing degrees of hardness.

5. The multilayer wiring substrate according to claim 1, wherein the bonding layer has an insulating fiber layer therein.

6. The multilayer wiring substrate according to claim 1, wherein the second core member has a greater thickness than the first core member.

7. The multilayer wiring substrate according to claim 1, wherein the second core member has cavities therein.

* * * * *